United States Patent [19]

Kurata

[11] 4,127,863
[45] Nov. 28, 1978

[54] GATE TURN-OFF TYPE THYRISTOR WITH SEPARATE SEMICONDUCTOR RESISTIVE WAFER PROVIDING EMITTER BALLAST

[75] Inventor: Mamoru Kurata, Tokyo, Japan

[73] Assignee: Tokyo Shibaura Electric Co., Ltd., Kawasaki, Japan

[21] Appl. No.: 876,140

[22] Filed: Feb. 8, 1978

Related U.S. Application Data

[63] Continuation of Ser. No. 727,345, Sep. 28, 1976, abandoned.

[30] Foreign Application Priority Data

Oct. 1, 1975 [JP] Japan .................................. 50-117642
Oct. 20, 1975 [JP] Japan .................................. 50-125415

[51] Int. Cl.² ............................................. H01L 29/74
[52] U.S. Cl. ......................................... 357/38; 357/36; 357/51; 357/65; 357/71; 357/79
[58] Field of Search ....................... 357/38, 39, 36, 51, 357/79, 65, 71

[56] References Cited

U.S. PATENT DOCUMENTS

| | | | |
|---|---|---|---|
| 3,460,007 | 8/1969 | Scott | 357/36 |
| 3,462,658 | 8/1969 | Worchel et al. | 357/36 |
| 3,504,239 | 3/1970 | Johnson et al. | 357/36 |
| 3,532,941 | 10/1970 | Boyer | 357/79 |
| 3,611,072 | 10/1971 | Hamilton | 357/38 |
| 3,667,008 | 5/1972 | Katnack | 357/36 |
| 3,858,096 | 12/1974 | Kuhrt et al. | 357/79 |

*Primary Examiner*—Joseph E. Clawson, Jr.
*Attorney, Agent, or Firm*—Oblon, Fisher, Spivak, McClelland & Maier

[57] ABSTRACT

A gate turn-off type thyristor comprises a semiconductor body having four sequentially contiguous layers, adjacent two of which are of opposite type conductivity and form a PN junction therebetween, one outer layer constituting a cathode layer of said body being divided into a plurality of mutually independent layer portions; and first and second electrodes packing said semiconductor material body. Between the cathode layer and the electrode is disposed a semiconductor wafer formed with high impurity concentration surface layers for permitting the wafer to ohmically contact with said cathode layer and said electrode, respectively.

2 Claims, 19 Drawing Figures

GATE TURN-OFF TYPE THYRISTOR WITH SEPARATE SEMICONDUCTOR RESISTIVE WAFER PROVIDING EMITTER BALLAST

This is a continuation of application Ser. No. 727,345, filed Sept. 28, 1976 now abondoned.

BACKGROUND OF THE INVENTION

This invention relates to a semiconductor device, and more particularly to a gate turn-off type thyristor (which is hereinafter referred to as "GTO" type thyristor) having a turn-off function.

A conventional GTO type thyristor is generally constructed as shown in, for example, FIG. 1. Namely, the conventional GTO type thyristor comprises a semiconductor material body composed of four successively continguous layers - a first P type semiconductor layer 11, a first N type semiconductor layer 12 formed thereon, a second P type semiconductor layer 13 formed thereon, and a second N type semiconductor layer 14 formed thereon, said second N type layer 14 being formed into a plurality of independent N type layer portions 14a, 14b, 14c, ..., and is constructed such that on the respective surfaces of the first P type layer 11, second P type layer 13, and second N type layer portions 14a, 14b, 14c, ... a first electrode 15, second electrode 16 and third electrodes 17a, 17b, 17c, ... are provided, respectively; and a first metallic member 18 constituting a first package electrode is provided on the first electrode 15 and a second metallic member 19 constituting a second package electrode is provided on the third electrodes 17a, 17b, 17c, ... In the GTO type thyristor having the above-mentioned construction, the first P type layer 11 is used as an anode region, the first N type layer 12 is used as a base region, the second P type layer 13 is used as a gate region, and the second N type layer 14 is used as a cathode region. Note that in this specification the GTO type thyristor is defined to mean a thyristor element which is capable of being rendered nonconductive, by applying a reverse bias current signal to the gate of the thyristor element kept in a conductive state.

The above-mentioned conventional GTO type thyristor is generally manufactured as follows.

First, as shown in FIG. 2A, an N type silicon substrate 12 is prepared. Then, by diffusing a trivalent impulity, for example, boron (B) into the substrate 12 first and second P type layer 11, 13 are formed therein as shon in FIG. 2B. Subsequently, by diffusing a pentavalent impurity, for example phosphorus (P) into the P type layer 13, a second N type layer 14 is formed therein as shown in FIG. 2C. Further, by mesaetching the second N type layer 14 at prescribed portions thereof, the layer 14 is divided into a plurality of N type layer portions 14a, 14b, 14c, ... as shown in FIG. 2D. Next, by vacuum-depositing aluminum on the semiconductor material body constructed into the above-mentioned four-layer structure, a first aluminum electrode 15, second aluminum electrode 16, and third aluminium electrodes 17a, 17b, 17c, ... are formed, as shown in FIG. 2E, on the first P type layer 11, second P type layer 13, and second N type layer portions 14a, 14b, 14c, ..., respectively. Thereafter, as shown in FIG. 2F, a first metallic member 19 constituting a first package electrode is disposed commonly on the third aluminium electrodes 17a, 17b, 17c, ..., while a second metallic member 18 constituting a second package electrode is disposed on the first aluminium layer 15. The GTO type thyristor shown in FIG. 1 is formed by the foregoing manufacturing process.

Generally, it is impossible from the standpoint of manufacturing technique that the semiconductor layers constituting the semiconductor material body each have a uniform impurity concentration over the entire region of a given plane intersecting the thickness direction of each layer at right angles thereto. Further, it is also impossible, due to the incomplete crystalline structure of the semiconductor material body used or due to the lattice defects in the crystal thereof, that the lifetime of minority carriers injected into ech semiconductor layer becomes equal over the entire region of a given plane intersecting the thickness direction of each layer at right angles thereof. Further, generally, in order to permit the turn-off function to be reliably achieved and also to permit a large current to flow in the GTO type thyristor, this thyristor has its cathode layer constituted by a plurality of mutually independent cathode layer portions as shown in FIG. 1. These cathode layer portions are usually formed by mesa-etching the cathode layer formed on the gate layer. In this case, however, it is impossible from the technical point of view of form such plurality of cathode layers into the same configuration and dimension.

For the above-mentioned reasons, the conventional GTO type thyristor has the following drawbacks due to the occurrence of variation in the amount of current flowing in the thyristor units (which are defined to mean, in FIG. 1, the one comprised of the anode region 11, base region 12, gate region 13 and cathode region 14a, the one comprised of the anode region 11, base region 12, gate region 13 and cathode region 14b, and the one comprised of the anode region 11, base region 12, gate region 13 and cathode region 14c, respectively).

(1) The total amount of current capable of being passed through the thyristor element as a whole can not be increased.

(2) Where the above-mentioned current variation is extremely wide, a large current concentratedly flows in a particular thyristor unit, which causes a damage thereto, which results in a damage or breakage of the thyristor as a whole.

(3) The turn-off times for the thyristor units differ from each other.

SUMMARY OF THE INVENTION

Accordingly, it is the object of the invention to provide a GTO type thyristor which is capable of eliminating the above-mentioned drawbacks and makes zero the variation in the amount of current flowing in the thyristor units.

According to the invention, there is provided a gate turn-off type thyristor comprising a semiconductor body having four sequentially contiguous layers, adjacent two of which are of opposite type conductivity and form a PN junction therebetween, one outer layer constituting a cathode layer of said body being divided into a plurality of mutually independent layer portions; a first conductive ohmic-contact layer provided on each of said cathode layer portions; a second conductive ohmic-contact layer provided on the other outer layer of said body; a first ohmic-contact electrode provided on an inner layer contiguous to said one outer layer; a semiconductor wafer acting as a series resistor with respect to said cathode layer portions and having its one high impurity concentration surface layer ohmically connected to said first conductive ohmic-contact layer;

a second electrode ohmically contacted with the other high impurity concentration surface layer of said semiconductor wafer; and a third electrode contacted with said second conductive ohmic-contact layer.

According to the present GTO type thyristor having the foregoing construction, a semiconductor wafer is disposed between the first electrode and the cathode layer portions. It follows, therefore, that each thyristor unit has a series resistor equivalently provided therefor. This prevents current from concentratedly flowing in a particular one of the thyristor units, for which reason, no variation takes place in the amount of current flowing in the thyristor units.

DETAILED DESCRIPTION OF THE PREFERRED EMBODIMENT

Figure 1:
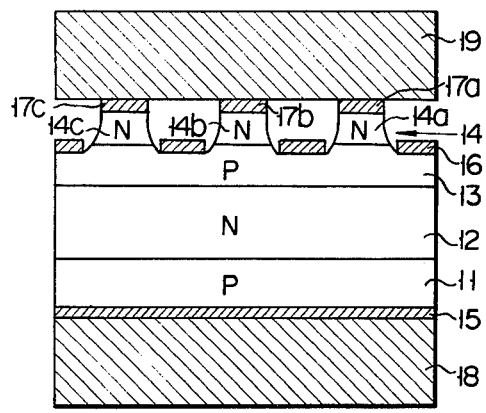
FIG. 1 is a sectional view of a conventional GTO type thyristor.
Figure 2A:
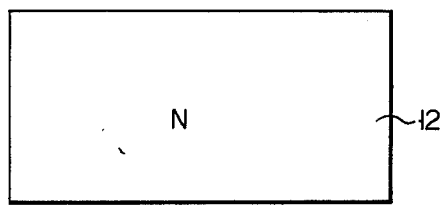
FIGS. 2A to 2F are views for explaining the steps of manufacturing the conventional thyristor shown in FIG. 1.
Figure 2B:
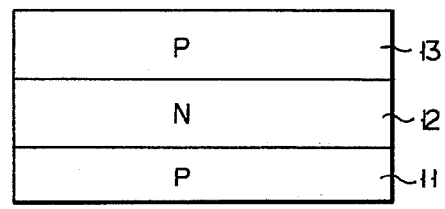
Figure 2C:
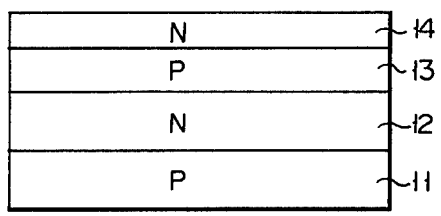
Figure 2D:
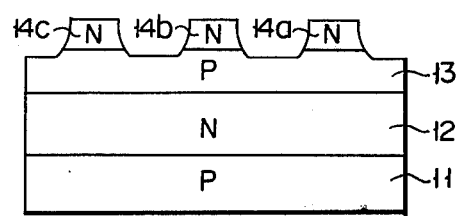
Figure 2E:
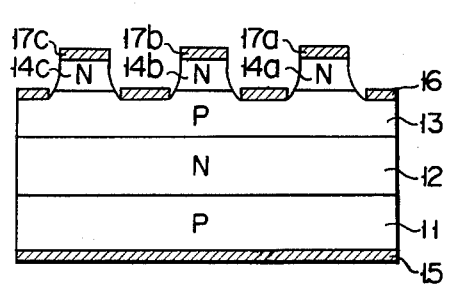
Figure 2F:
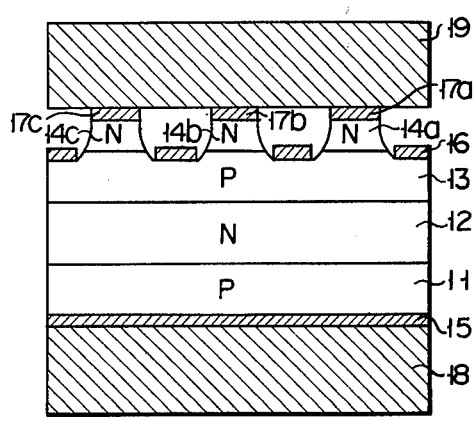

A GTO type thyristor of the invention will now be described by reference to FIG. 3. This thyristor is the same as the above-mentioned conventional GTO type thyristor except for the respect that the former thyristor is prepared by providing a semiconductor wafer 20 between the second package electrode 19 and cathode electrodes 17a, 17b, 17c, ... of the latter thyristor shown in FIG. 1. For a better understanding of the invention, therefore, the same parts and sections are denoted by the same reference numerals. Namely, the conventional GTO type thyristor comprises a semiconductor material body composed of four successively contiguous layers — a first P type semiconductor layer 11, a first N type semiconductor layer 12 formed thereon, a second P type semiconductor layer 13 formed thereon, and a second N type semiconductor layer 14 formed thereon, said second N type layer 14 being formed into a plurality of independent N type layer portions 14a, 14b, 14c, ..., and is constructed such that on the respective surfaces of the first P type layer 11, second P type layer 13, and second N type layer portions 14a, 14b, 14c, ... a first electrode 15, second electrode 16 and third electrodes 17a, 17b, 17c, ... are provided, respectively,; and a first metallic member 18 constituting a first package electrode is provided on the first electrode 15 and a second metallic member 19 constituting a second package electrode is provided commoly on the third electrodes 17a, 17b, 17c, ... through a semiconductor wafer 20. Used as the semiconductor wafer 20 is, for example, a silicon wafer which is so designed as to have a surface resistance $\rho_s$ of about 15($\Omega/\square$) by subjecting its both surfaces to impurity diffusion.

In the GTO type thyristor having the above-mentioned construction, the first P type layer 11, the second N type layer 12, the second P type layer 13, and the second N type layer 14 are used as an anode region, a base region, a gate region, and a cathode region, respectively.

Figure 3:
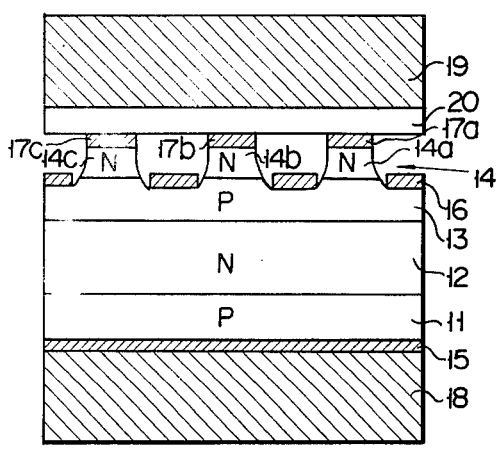
FIG. 3 is a sectional view of a GTO type thyristor according to an embodiment of the invention.
Figure 4A:
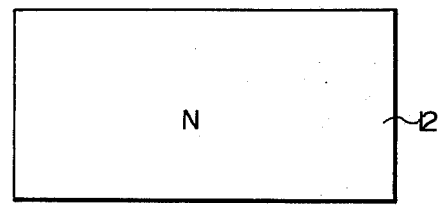
FIGS. 4A to 4G are views for explaining the steps of manufacturing the thyrsitor shown in FIG. 3.
Figure 4B:
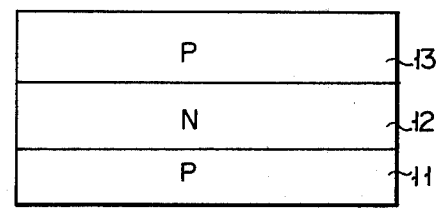
Figure 4C:
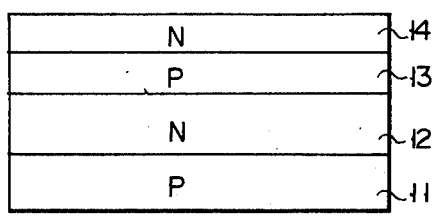
Figure 4D:
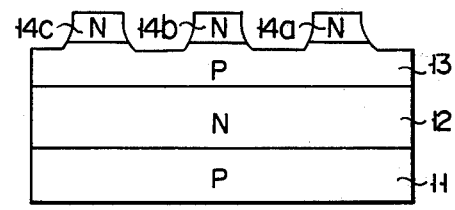
Figure 4E:
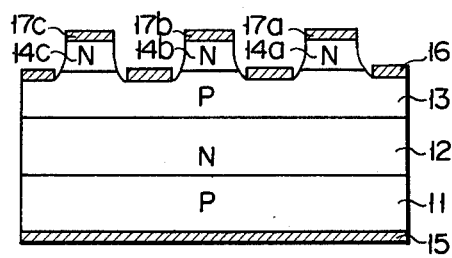
Figure 4F:
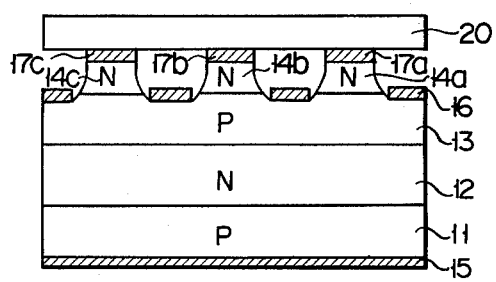
Figure 4G:
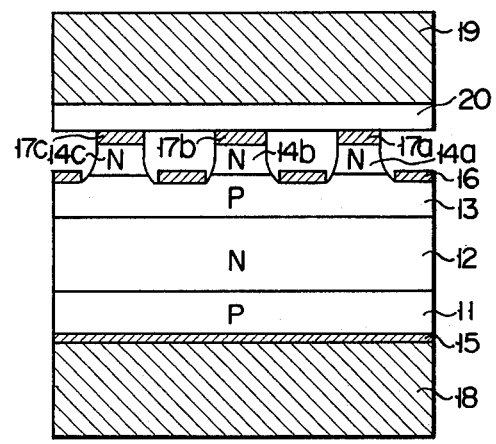

The GTO type thyristor of the invention shown in FIG. 3 is manufactured, for example, as follows. First, an N type silicon substrate 12 is prepared as shown in FIG. 4A. Next, a first P type layer 11 and a second P type layer 13 are formed in the substrate 12 as shown in FIG. 4B by diffusing a trivalent impurity, for example, boron (B) into the substrate 12. Subsequently, a second N type layer 14 is formed as shown in FIG. 4C by diffusing a pentavalent impurity, for example, phosphorus (P) into the P type layer 13. Further, the second N type layer 14 is divided into a plurality of N type layer portions 14a, 14b, 14c, ... by being mesa-etched at prescribed portions as shown in FIG. 4D. Next, by vacuum-depositing aluminum on the resulting semiconductor material body constructed into a four-layer structure a first aluminum electrode 15, a second aluminum electrode 16, and third aluminum electrodes 17a, 17b, 17c, ... are formed on the first P type layer 11, second P type layer 13, and second N type layer portions 14a, 14b, 14c, ..., respecitvely, as shown in FIG. 4E. Next, as shown in FIG. 4F, a semiconductor wafer 20 is disposed commonly on all of the third aluminum electrodes 17a, 17b, 17c, .... Thereafter, as shown in FIG. 4G, a fist metallic member 18 constituting a first package electrode is disposed on the first aluminium electrode 15, while a second metallic member 19 constituting a second package electrode is disposed on the semiconductor wafer 20. The GTO type thyristor shown in FIG. 3 is manufactured by the above-mentioned process.

Figure 5:
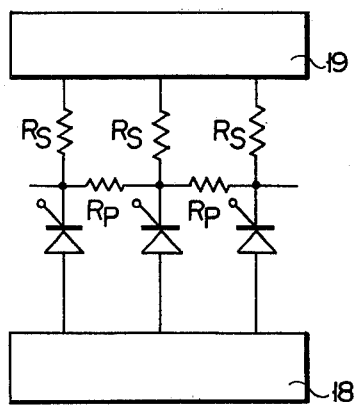
FIG. 5 is a diagram showing an equivalent circuit of the thyristor shown in FIG. 3.

In the above-mentioned embodiment, a silicon wafer is used as the semiconductor wafer 20. But this invention is not limited thereto, and other semiconductor wafers, for example, germanium wafer can of course be used. Further, as a matter of course, for the purpose of making as small as possible the contact resistance with the cathode electrodes 17a, 17b, 17c, ... and the second package electrode 19, the semiconductor wafer 20 should have its both surfaces formed into high impurity concentration layers, respectively. Preferably this impurity concentration is less than $5 \times 10^{18}$ atoms/cm$^3$. In this case, the high impurity concentration layer is of the same conductivity type as that of the wafer 20. Furthermore, preferably, the semiconductor wafer 20 has a thickness of about 200 μm and its high impurity concentration surface layers have a thickness of below 1 μm. As apparent from FIG. 5, the GTO type thyristor having the foregoing construction takes the form in which series resistors $R_s$ are equivalently provided between the second package electrode 19 and the cathode regions of the thyristor units (which are defined to mean, in FIG. 3, the one comprised of the anode region 11, base region 12, gate region 13 and cathode region 14a, the one comprised of the anode region 11, base region 12, gate region 13 and cathode region 14b, and the one comprised of the anode region 11, base region 12, gate region 13 and cathode region 14c, respectively). For this reason, where current is concentratedly allowed to flow in a particular thyristor unit to permit a large current to flow therein, the voltage drop at both ends of the equivalent series resistor $R_s$ of that particular thyristor unit is increased to prevent a large current from flowing in that particular thyristor unit. Since, as a result, the variation in the amount of current flowing in the thyristor units becomes zero, there result the followings: (1) the total amount of current capable of being passed through the thyristor element as a whole can be increased; (2) the damage or breakage of the thyristor element due to a concentrated flow of current into a particular thyristor unit is prevented; and (3) the turn-off times for the thyristor units are allowed to coincide with each other.

Figure 6:
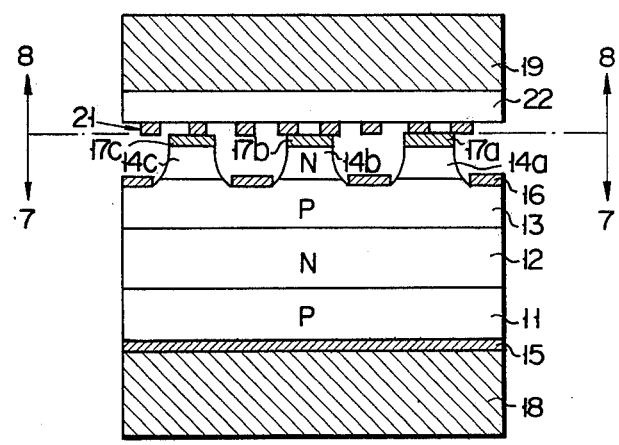
FIG. 6 is a sectional view of the GTO type thyristor according to another embodiment of the invention.

In FIG. 6, the GTO type thyristor according to another embodiment of the invention is illustrated.

As apparent from FIG. 6, this embodiment is completely the same as that shown in FIG. 3 except that a semiconductor wafer 22 having at one surface a plurality of island-like metallic layers 21, in place of the semiconductor wafer 20 in the embodiment of FIG. 3, is so disposed that their metallic layers may contact the cathode electrodes 17a, 17b, 17c, . . . . The same parts and sections are denoted by the same reference numerals, and a detailed description thereof is omitted. Note that the semiconductor wafer 22 and the insland-like metallic layers 21 should be joined with each other so as not to produce any contact resistance therebetween; and such construction is obtained, for example, by vacuum-depositing metal, for example, aluminum over an entire region of one surface of the semiconductor wafer 22 and covering a prescribed pattern of thus formed and etching for removal unnecessary portions of that aluminium layer.

Figure 7:
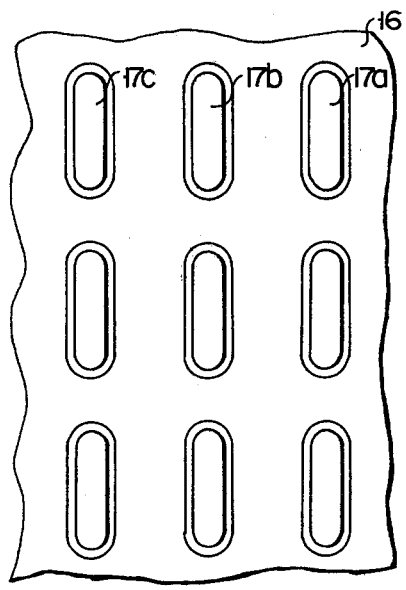
FIG. 7 is a view taken along the line 7-7 of FIG. 6.
Figure 8:
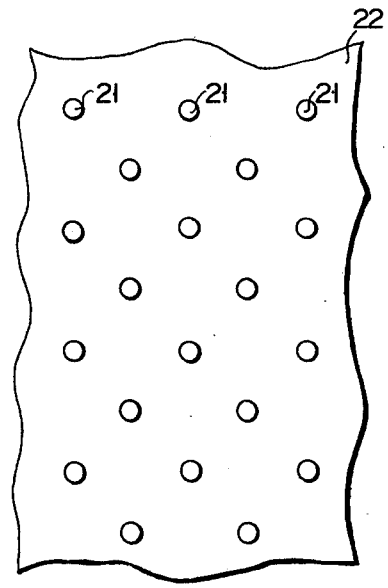
FIG. 8 is a view taken along the line 8-8 of FIG. 6.

In FIG. 7, there is schematically shown the construction of the cathode electrodes 17a, 17b, 17c, . . . of the semiconductor material body. In FIG. 8, there is schematically shown the semiconductor wafer 22 provided with the metallic layers 21. The embodiment of FIG. 6 can be also regarded as being constructed, as in the case of the preceding embodiment, such that series resistors are equivalently provided between the second package electrode and the cathode electrodes of the thyristor units. Accordingly, the variation in the amount of current flowing in the thyristor units becomes zero to obtain the following results: (1) the total amount of current capable of being passed through the thyristor element as a whole can be increased; (2) the damage or breakage of the thyrsitor element due to a concentrated flow of current into a particular thyristor unit is prevented; and (3) the turn-off times for the thyristor units are brought into coincidence with each other. Further, unlike the embodiment of FIG. 3 wherein the cathode electrodes 17a, 17b, 17c, . . . are directly in contact with the semiconductor wafer 20, that is, metal and semiconductor are directly contacted with each other, this embodiment of FIG. 6 is constructed such that the cathode electrodes 17a, 17b, 17c, . . . contact the semiconductor wafer 22 through the metallic layers 21, that is, metal-to-metal contact is achieved. For this reason, the contact resistance of the cathode electrodes 17a, 17b, 17c, . . . with the semiconductor wafer 22 can be suppressed to a small value. Accordingly, the forward voltage drop of the thyristor element can be decreased, and this is very effective for the GTO type thyristor which is naturally used as an element for large power.

Besides, in order that the insulated condition between adjacent two of the cathode electrodes 17a, 17b, 17c, . . . , may be maintained, the layers 21 should be so constructed as not to make a short-circuit between adjacent two of the cathode electrodes 17a, 17b, 17c, . . . . Therefore, as a matter of course, it is necessary that the maximum width of that cross section of the island-like metallic layers 21 which is parallel to the horizontal plane of the semiconductor wafer 22 should be smaller than the minimum width between adjacent two of the cathode electrodes 17a, 17b, 17c, . . . .

Note that it is most effective that the said crosssectional configuration of the island-like metallic layers 21 is the same as that of the metallic electrodes 17a, 17b, 17c, . . . from the standpoint of theory of operation. However, in such a case, it is actually very difficult that the island-like metallic layers 21 are exactly aligned in cross section with the metallic electrodes 17a, 17b, 17c, respectively. Then, if consideration is given to a theory of electric operation as well as such difficulty in alignment, the cross-sectional configuration of the metallic layers 21 will preferably be circular.

Further, as in the case of the preceding embodiment, also in this embodiment, a silicon wafer, germanium wafer or the like may be used as the semiconductor wafer 22. Further, for the purpose of rendering as small as possible the contact resistance with the island-like metallic layers 21 and the second metallic member 19, the semiconductor wafer 22 should be so designed that its both surfaces may be formed into a high impurity concentration layer. Preferably, this impurity concentration is less than $5 \times 10^{18}$ atoms/cm$^3$. In this case, the high impurity concentration layer is of the same conductivity type as that of the wafer 22. Further, preferably, the wafer 22 has a thickness of about 200 $\mu$m and the high impurity concentration layers at both surfaces thereof each have a thickness of less than 1 $\mu$m.

What is claimed is:

1. A gate turn-off type thyristor comprising:
    a first semiconductor body having four sequentially continuous layers, an adjacent two of which are of opposite conductivity types and form a PN junction therebetween and a first outer one of which constitutes a cathode layer divided into a plurality of mutually independent layer portions;
    a first ohmic-contact electrode formed on each of the cathode layer portions;
    a second ohmic-contact electrode formed on a second outer one of the layers of the first semiconductor body;
    a third ohmic-contact electrode formed on an inner layer continuous to the first outer layer of the first semiconductor body;
    a second separate semiconductor body disposed on the first ohmic-contact electrode formed on each of the cathode layer portions so that the second separate semiconductor body is detachable from the first ohmic-contact electrode formed on each of the cathode layer portions, the second separate semiconductor body acting as a series resistor with respect to the cathode layer portions of the first semiconductor body and having a first high impurity concentration surface layer electrically connected to the first ohmic-contact electrode formed on each of the cathode layer portions and a second high impurity concentration surface layer;
    a pair of first and second package electrodes, the first package electrode being contacted to the second high impurity concentration surface layer of the second separate semiconductor body, and the second package electrode being contacted to the second ohmi-contact electrode formed on the second outer layer of the first semiconductor body;
    the first high impurity concentration surface layer of the second separate semiconductor body including a plurality of metal islands, the maximum width of which taken along a plane intersecting the thickness direction of the body at right angles thereto is smaller than a minimum one of the intervals between the cathode layer portions in order to avoid occurrence of a short circuit between two adjacent mutually independent cathode layer portions.

2. A gate turn-off type thyristor according to claim 1 wherein the second separate semiconductor body is electrically connected to the first conductive ohmic-contact electrode through the metal islands.

* * * * *